(12) United States Patent
Hamashita

(10) Patent No.: US 6,653,967 B2
(45) Date of Patent: Nov. 25, 2003

(54) FULLY DIFFERENTIAL SAMPLING CIRCUIT

(75) Inventor: Koichi Hamashita, Atsugi (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 0 days.

(21) Appl. No.: 10/082,208

(22) Filed: Feb. 26, 2002

(65) Prior Publication Data

US 2002/0149508 A1 Oct. 17, 2002

(30) Foreign Application Priority Data

Feb. 27, 2001 (JP) ........................................ 2001-052497

(51) Int. Cl.$^7$ .............................................. H03M 1/12
(52) U.S. Cl. .......................................... 341/172; 341/143
(58) Field of Search ................................ 341/155, 143, 341/172, 131; 327/39

(56) References Cited

U.S. PATENT DOCUMENTS

| | | | | |
|---|---|---|---|---|
| 3,571,629 A | * | 3/1971 | Hilberman | 327/39 |
| 4,918,454 A | | 4/1990 | Early et al. | 341/172 |
| 5,191,331 A | * | 3/1993 | Karema et al. | 341/131 |
| 5,629,701 A | * | 5/1997 | Ritoniemi et al. | 341/143 |
| 5,682,161 A | * | 10/1997 | Ribner et al. | 341/143 |
| 5,742,246 A | * | 4/1998 | Kuo et al. | 341/143 |
| 5,757,300 A | * | 5/1998 | Koilpillai et al. | 341/143 |
| 5,949,361 A | * | 9/1999 | Fischer et al. | 341/143 |
| 5,982,316 A | * | 11/1999 | Shin | 341/143 |
| 6,218,972 B1 | * | 4/2001 | Groshong | 341/143 |
| 6,249,236 B1 | * | 6/2001 | Lee et al. | 341/143 |

FOREIGN PATENT DOCUMENTS

JP 63067920 3/1988

OTHER PUBLICATIONS

Bingzin Li; Li–Rong Zheng; Tenhumen, H, "Hierarchical modeling of sigma delta modulators for noise coupling analysis", Apr. 1999 Southwest Symposyium on Mixed–Signal Design, pp. 58–62.*

Hamashita et al., "A Single–Chip Stereo Audio Codec," IEEE 1993 Custom Integrated Circuits Conference, pp 28.4.1–28.4.4 (also attached 11–page draft used at presentation).

Fujimori et al., "A 5v Single–Chip Delta–Sigma Audio A/D Converter with 111 dB Dynamic–Range," IEEE 1996 Custom Integrated Circuits Conference, pp. 415–418.

Fujimori et al., "A 5v Single–Chip Delta–Sigma Audio A/D Converter with 111 dB Dynamic–Range," *IEEE Journal of Solid–State Circuits*, vol. 32, No. 3, Mar. 1997, pp. 329–336.

* cited by examiner

Primary Examiner—Jean Bruner Jeanglaude
(74) Attorney, Agent, or Firm—Finnegan, Henderson, Farabow, Garrett, & Dunner, L.L.P.

(57) ABSTRACT

To provide a fully differential sampling circuit which reduces a sampling error to suppress the occurrence of a second harmonic component. The sampling error is resulted from voltage dependence of a capacitance of the capacitor formed on a semiconductor substrate.

The present invention includes a first sampling capacitor 27, a second sampling capacitor 28, four switches 31, 32, 33', and 34 for charging and discharging the first sampling capacitor 27, four switches 41, 42, 43', and 44 for charging and discharging the second sampling capacitor 28, and a fully differential operational amplifier 20 including a first integral capacitor 25 and a second sampling capacitor 26. An upper layer electrode 28b and a lower layer electrode 28a of the second sampling capacitor 28 are opposite to the first sampling capacitor 27 in connecting direction (state).

7 Claims, 7 Drawing Sheets

FULLY DIFFERENTIAL SAMPLING CIRCUIT

BACKGROUND OF THE INVENTION

1. Field of the Invention

The present invention relates to a fully differential sampling circuit for single end input that performs fully differential sampling/holding on a single end input signal without an inverter amplifier and converts the signal to a fully differential sampling signal, and concerns an oversampling delta sigma A/D converter using the same.

Further, the present invention is characterized in that a linear term of voltage dependence of a capacitance is complementarily canceled regarding a capacitor formed on a semiconductor integrated circuit to reduce a sampling error appearing when an input signal is sampled, that is, to reduce second harmonic distortion which has been normally caused by a linear term of voltage dependence of capacitance of the capacitor.

2. Description of the Related Art

Recently, when an analog signal is handled on a semiconductor integrated circuit, the following methods are available: a method for handling a continuous-time analog signal as it is by an operational amplifier, a resistor, and a capacitor, and a method for sampling an analog signal at a predetermined sampling rate and processing the signal in a sampling time system.

In the latter method, an input differential pair is composed of a MOS transistor, and a MOS operational amplifier having no input leakage current has been developed. Thus, a so-called switched capacitor circuit has appeared, which is composed of an operational amplifier, a MOS switch, and a capacitor. The switched capacitor has been mainstream of analog signal processing until recently.

In addition to a switched capacitor filter, such technology of the switched capacitor circuit is applicable to a so-called a delta sigma modulator, which combines integrators on multiple stages and an A/D converter of a small number of bits and sends feedback of the result of A/D conversion to a first stage. The switched capacitor circuit is also applied to an oversampling delta sigma A/D converter which has been recently mainstream regarding an audio band.

Such a switched capacitor circuit firstly came as a single end type having only a signal system of a signal path. However, in response to the needs for a single chip combined with a digital circuit, which has become faster by the recent fine process, and a noise solution, a so-called fully differential switched capacitor circuit has become mainstream, in which signal paths are divided into two positive and negative systems and a difference therebetween is used as a signal level to cancel high-speed digital noise as in-phase noise.

Meanwhile, an ordinary analog signal is a single end signal centered at a certain input reference potential. Thus, in order to capture a single end signal to the fully differential switched capacitor circuit, the signal needs to be converted to a fully differential signal. Namely, when an input single end signal is used as a positive signal, it is necessary to produce a negative signal by inverting the positive signal.

The most typical method for producing a negative signal is to make inversion by an inverter amplifier and supply both of positive and negative signals to a fully differential switched capacitor circuit while maintaining a continuous-time system. As shown in FIG. 6, a single end input signal is used as a positive signal, the single end input signal is supplied to a positive signal input terminal 3 of a fully differential switched capacitor circuit 2 on a subsequent stage, an inverted signal is produced by an inverter amplifier 7 constituted by a single end operational amplifier 4, an input resistor 5, and a feedback resistor 6, and the inverted signal is supplied to a negative signal input terminal 9 of the fully differential switched capacitor circuit 2.

The fully switched capacitor circuit 2 samples/holds a fully differential input signal, which is a difference between positive signal input and negative signal input, according to a switched capacitor operating clock (CK). The fully switched capacitor circuit 2 performs a predetermined switched capacitor operation, outputs positive and negative signals respectively from a positive signal output terminal 11 and a negative signal output terminal 12, and uses a difference between the output signals as a fully differential output signal.

As a specific example of the fully switched capacitor circuit, FIG. 7 shows a fully differential switched capacitor integrator having the function of sampling/holding. The following will focus on the sampling/holding function and increased accuracy of the function.

Further, as shown in FIG. 8(A), a capacitor 15 formed on a semiconductor substrate is generally constituted by two layers of polysilicon electrode plates 16 and 17 that contain N-type impurity such as phosphorus and a dielectric film 18 composed of an oxide film and the like between the electrode plates 16 and 17. The capacitor 15 is formed on a semiconductor substrate 19 such as a silicon substrate. As symbols shown in a circuit diagram, capacitor symbols are used to separately represent first polysilicon serving as a lower layer and second polysilicon serving as an upper layer. The capacitor symbols represent the former layer as a curve and the latter layer as a straight line (FIG. 8(B)).

The fully differential switched capacitor integrator of FIG. 7 is constituted by a fully differential operational amplifier 20, which has negative and positive input terminals 21 and 22 and positive and negative output terminals 23 and 24, a first integral capacitor 25 which is disposed between the negative input terminal and the positive output terminal of the fully differential operational amplifier 20 and has a capacitance Ci, a second integral capacitor 26 which is disposed between the positive input terminal and the negative output terminal and has a capacitance Ci, a first sampling capacitor 27 which is disposed between the input terminal 3 and the negative input terminal (so-called summing node on the positive side) 21 of the fully differential operational amplifier 20 to perform the sampling/holding function of a positive signal and has a capacitance Cs, four switches 31 to 34, a second sampling capacitor 28 which is disposed between the input terminal 9 and the positive input terminal (so-called summing node on the negative side) 22 of the fully differential operational amplifier to perform the sampling/holding function for a negative signal and has a capacitance Cs, and four switches 41 to 44.

The following will discuss the operation of the integrator configured thus.

When an operating clock CK is in positive phase ($\phi$=H, $\phi$B=L), the switches 31, 32, 41, and 42 are turned on, and the switches 33, 34, 43, and 44 are turned off. Therefore, a lower layer electrode of the first sampling capacitor 27 is connected to the input terminal 3 via the switch 31, and an upper layer electrode is connected to an operating common potential (analog ground) via the switch 32. Further, a lower layer electrode of the second sampling capacitor 28 is connected to the input terminal 9 via the switch 41, and an upper layer electrode is connected to the operating common potential via the switch 42.

As a result, a positive signal from the input terminal 3 and a negative signal from the input terminal 9 are sampled at the first and second sampling capacitors 27 and 28. When the input terminal 3 has a potential of $VIN_+$ and the input terminal 9 has a potential of $VIN_-$, charges Q1 and Q2 of the following equations are respectively accumulated in lower layer electrodes 27a and 28a of the first and second sampling capacitors 27 and 28.

$Q1=(VIN_+)\cdot Cs$ $Q2=(VIN_-)\cdot Cs$

Moreover, charges Q1' and Q2' of the following equations are respectively accumulated in upper layer electrodes 27b and 28b of the sampling capacitors 27 and 28.

$Q1'=-Q1=-(VIN_+)\cdot Cs$ $Q2'=-Q2=-(VIN_-)\cdot Cs$

In contrast, when the operating clock CK is in opposite phase (φ=L, φB=H), the switches 31, 32, 41, and 42 are turned off and the switches 33, 34, 43, and 44 are turned on. Thus, the lower layer electrode of the first sampling capacitor 27 is connected to the operating common potential via the switch 33, and the upper layer electrode is connected to the input terminal 21 via the switch 34. Further, the lower layer electrode of the second sampling capacitor 28 is connected to the operating common potential via the switch 43, and the upper layer electrode is connected to the input terminal 22 via the switch 44.

As a result, the charges Q1' and Q2' accumulated in the sampling capacitors 27 and 28 are released and shifted to the upper layer electrodes of the first and second integral capacitors 25 and 26.

Therefore, the following charges –Q1' and –Q2' are collected in the lower layer electrodes on the output terminals of the first and second integral capacitors 25 and 26.

$-Q1'=(VIN_+)\cdot Cs$ $-Q2'=(VIN_-)\cdot Cs$

Thus, in the fully differential operational amplifier, the positive output terminal 11 has a potential $VOUT_+$ and the negative output terminal 12 has a potential $VOUT_-$ according to the following equations.

$VOUT_+=-Q1'/Ci=(VIN_+)\cdot Cs/Ci$ $VOUT_-=-Q2'/Ci=(VIN_-)\cdot Cs/Ci$

As a result, a fully differential output VOUTdiff is computed by the following equation.

$VOUTdiff=(VOUT_+)-(VOUT_-)=\{(VIN_+)-(VIN_-)\}\cdot Cs/Ci$

Namely, the fully differential output VOUTdiff is obtained by sampling a fully differential input signal $(VIN_+)-(VIN_-)$ and integrating the signal by using an integral gain of Cs/Ci. Besides, the inverted signal $VIN_-$ obtained by inverting the input signal $VIN_+$ is expressed by $VIN_-=-VIN_+=-VIN$. Thus, the fully differential output VOUTdiff is expressed by the following equation.

$VOUTdiff=2\cdot VIN\cdot(Cs/Ci)$

Therefore, the fully differential output VOUTdiff is obtained by sampling a single end input signal VIN at every cycle of the operating clock CK and integrating the signal by integral gain of 2·(Cs/Ci).

The above description discussed the operation of the configuration for producing a fully differential signal in a typical continuous-time system and supplying the signal to the fully differential switched capacitor circuit. Here, it should be noted that a sufficiently advanced inverter amplifier needs to be added.

Namely, it is necessary to have driving force enough to sufficiently absorb feed through noise, which is caused by turning on/off the sampling switch connected to the input terminal of the fully differential circuit on a subsequent stage, and flicker noise and thermal noise need to be sufficiently low. This is because noise occurring thus has no correlation with a positive signal, so that the noise cannot be canceled by the fully differential circuit and is added to an original signal, resulting in deterioration in S/N ratio (signal-to-noise ratio). In order to avoid the above problem, an operational amplifier which is large in area and consumed current has been used.

Further, two resistors need to be minimized in size because they cause thermal noise. However, it is necessary to improve the driving capability of the operational amplifier to drive small resistors, thereby further increasing consumed current. Moreover, when both resistance ratios cannot be obtained accurately, a gain error of an inverted signal appears. Thus, sufficient attention should be given to a layout and a manufacturing process. A method for omitting the inverter amplifier has been demanded in view of reduction in cost and consumed current and improvement in analog capability.

Considering the above circumstances, a method for producing no inverted signal in a continuous-time system and eliminating an additional inverter amplifier, that is, a so-called differential sampling method for a single end input signal has been devised. As a specific example, the following will discuss the configuration and operation of an integrator shown in FIG. 9.

In the integrator of FIG. 9, when an operating clock CK is in opposite phase (φ=L, φB=H), a switch 33' for discharging the lower layer electrode 27a of the first sampling capacitor 27 is connected to the input terminal 9, and a switch 43' for discharging the lower layer electrode 28a of the second sampling capacitor 28 is connected to the input terminal 3. A single end input signal is supplied as a positive signal as it is from the input terminal 3. The input terminal 9 is connected to an analog ground, which is an operating reference potential of the input signal. Other configurations are the same as those of the typical fully differential circuit shown in FIG. 7.

Next, the operation of the integrator will be discussed.

When the operating clock CK is in positive phase (φ=H, φB=L), the switches 31, 32, 41, and 42 are turned on and the switches 33', 34, 43', and 44 are turned off. Therefore, the lower layer electrode 27a of the first sampling capacitor 27 is connected to the input terminal 3, and the upper layer electrode 27b is connected to the operating common potential. Further, the lower layer electrode 28a of the second sampling capacitor 28 is connected to the input terminal 9, and the upper layer electrode 28b is connected to the operating common potential.

As a result, a positive signal potential $VIN_+$ is inputted to the input terminal 3, and the input terminal 9 is connected to the analog ground. Thus, the following charges Q1 and Q2 are respectively accumulated in the lower layer electrodes 27a and 28a of the first and second sampling capacitors 27 and 28.

$$Q1 = (VIN_+) \cdot Cs$$

$$Q2 = 0$$

Moreover, the following charges Q1' and Q2' are respectively accumulated in the upper layer electrodes 27b and 28b of the sampling capacitors 27 and 28.

$$Q1' = -(VIN_+) \cdot Cs$$

$$Q2' = 0$$

Namely, the first sampling capacitor 27 samples an input signal, and the second sampling capacitor 28 enters a discharging state.

In contrast, when the operating clock CK is in opposite phase ($\phi$=L, $\phi$B=H), the switches 31, 32, 41, and 42 are turned off, and the switches 33', 34, 43', and 44 are turned on. Thus, the lower layer electrode 27a of the first sampling capacitor 27 is connected to the analog ground via the switch 33', and the upper layer electrode 27b is connected to the input terminal 21. Further, the lower layer electrode 28a of the second sampling capacitor 28 is connected to the input terminal 3 via the switch 43', and the upper layer electrode 28b is connected to the input terminal 22.

Therefore, charge Q1' accumulated in the first sampling capacitor 27 is released and shifted to the first integral capacitor 25. Charge of $-Q1'=(VIN_+) \cdot Cs$ is collected in the output terminal electrode of the first integral capacitor 25, and the positive output terminal 11 has a potential $VOUT_+$ as expressed in the following equation.

$$VOUT_+ = -Q1'/Ci = (VIN_+) \cdot (Cs/Ci)$$

Meanwhile, in the second sampling capacitor 28, which is discharged when the operating clock is in positive phase, the lower layer electrode 28a is connected to the input terminal 3 and has a potential of $VIN_+$. Hence, charge of $Q2'=-(VIN_+) \cdot Cs$ is supplied to the upper layer electrode 28b from the second integral capacitor 26. As a result, charge of $-Q2'$ is collected in the electrode on the input terminal 22 of the second integral capacitor 26, charge of $Q2'=-(VIN_+) \cdot Cs$ is collected in the electrode on the output terminal, and the negative output terminal 12 has a potential $VOUT_-$ as expressed by the following equation.

$$VOUT_- = Q2'/Ci = -(VIN_+) \cdot (Cs/Ci)$$

As a result, a fully differential output VOUTdiff is expressed by the following equation.

$$VOUTdiff = (VOUT_+) - (VOUT_-) = 2 \cdot (VIN_+) \cdot (Cs/Ci)$$

According to the above equation, without an additional inverter amplifier, the same result can be obtained as the fully differential circuit of FIGS. 6 and 7 for producing an inverted signal in a continuous-time system.

As described above, the differential sampling method for single end input of FIG. 9 does not require an inverter amplifier for producing an inverted signal, so that the method is excellent in cost, consumed current, noise, and so on. However, another problem has occurred because a semiconductor process has been finer recently.

Namely, regarding an input signal having a frequency of $\omega$, second harmonic distortion having a frequency of $2\omega$ has been frequently observed. The larger voltage dependence of the following capacitor, the more adverse effect has been observed. The following will briefly discuss the cause of the effect.

As described above by using FIG. 8 a representative example of the capacitor formed on a semiconductor substrate is composed of two upper and lower polysilicon films serving as electrodes and an interlayer film composed of an oxide film and the like between the films. The finer the process, a capacitor structure has been developed with a larger capacitance per unit area. In order to increase a capacitance per area, the two upper and lower polysilicon films need to be closer to each other, namely, the oxide film serving as an interlayer film needs to be smaller in thickness.

Meanwhile, polysilicon and the like is not completely metallic and is used as a conductor by containing N-type or P-type impurity. When voltage is applied to the upper and lower polysilicon electrodes, a depletion layer is developed in a voltage direction on an interface of the bottom of the upper layer polysilicon electrode and the oxide film serving as an interlayer film or on an interface of the upper surface of the lower layer polysilicon electrode and the oxide film serving as an interlayer film. An electrically determined interlayer thickness varies according to an applied voltage.

Since the depletion layer is sufficiently small in thickness in ordinary cases, when the interlayer film has a large thickness as in the conventional process, the influence is small. In the recent fine process, as the interlayer film is smaller in thickness to several hundreds Å, the influence has become larger. The influence is expressed by a change in capacitance when voltage is applied to the capacitor, that is, voltage dependence of a capacitance of the capacitor.

As a specific example, FIG. 10 shows that the first polysilicon electrode serving as a lower layer has a reference potential and the second polysilicon electrode serving as an upper layer is changed in potential. The horizontal axis indicates a potential applied to the second polysilicon electrode relative to the first polysilicon electrode. The vertical axis indicates a capacitance C(Vc) between the electrodes when voltage is applied, in a ratio relative to a reference capacitance $C_0$ with no voltage being applied (Vc=0V).

As a specific example, FIG. 10 shows that a capacitance decreases while drawing a gentle curve according to an increase in applied voltage. Such a graph may have a rising curve due to characteristics of the manufacturing process. In formula where voltage dependence has a primary coefficient $\alpha$ and a secondary coefficient $\beta$, a capacitance is expressed by the following equation.

$$C(Vc) = C_0(1 + \alpha Vc + \beta Vc^2 + \dots)$$

In the case of $\alpha > 0$, a rising curve appears. In the case of $\alpha < 0$, a falling curve appears.

As described above, in the recent fine process, a primary coefficient $\alpha$ is extremely larger than that of the conventional process and is about several tens to several hundreds times a secondary coefficient $\beta$, so that a primary coefficient $\alpha$ is a dominant factor. Therefore, hereinafter, an approximate expression up to a linear term is used to simplify explanation. This approximation is sufficiently proper in view of practical use.

First, in the conventional fully differential circuit using an inverter amplifier that is shown in FIGS. 6 and 7, by a one-cycle operation performed in a positive phase and a negative phase of the operating clock CK, charge quantities Q1 and Q2, which are sampled by the first and second sampling capacitors 27 and 28 and transferred to the integral capacitors 25 and 26, are expressed by the following equations.

$$Q1 = (VIN_+) \cdot Cs = (VIN_+) \cdot Cs_0(1 + \alpha Vc)$$

$$Q2 = (VIN_-) \cdot Cs = (VIN_-) \cdot Cs_0(1 + \alpha Vc)$$

Here, a Vc value of the first polysilicon electrode on the input side is used as a reference value. Thus, charge quantities Q1 and Q2 are expressed by the following equations.

$$Q1 = (VIN_+) \cdot Cs_0(1 + \alpha(-VIN_+))$$

$$Q2 = (VIN_-) \cdot Cs_0(1 + \alpha(-VIN_-))$$

Here, since $VIN_- = -VIN_+$ is established, a charge quantity Q2 is expressed by the following equation.

$$Q2 = -(VIN_+) \cdot Cs_0(1 + \alpha(VIN_+))$$

Therefore, a quantity of transferred charge that contributes as a fully differential signal is expressed by the following equation.

$$Q1 - Q2 = (VIN_+) \cdot Cs_0(1 + \alpha(-VIN_+) + 1 + \alpha(VIN_+)) = 2 \cdot (VIN_+) \cdot Cs_0$$

As a result, the primary coefficient $\alpha$ of voltage dependence is completely deleted.

However, in the differential sampling method of FIG. 9, a charge quantity transferred at one cycle of the operating clock is similarly expressed by the following equation as for the first sampling capacitor 27.

$$Q1 = (VIN_+) \cdot Cs = (VIN_+) \cdot Cs_0(1 + \alpha Vc)$$
$$= (VIN_+) \cdot Cs_0(1 + \alpha(-VIN_+))$$

Meanwhile, a quantity of charge transferred from the second sampling capacitor 28 is expressed by the following equation.

$$Q2 = -(VIN_+) \cdot Cs = -(VIN_+) \cdot Cs_0(1 + \alpha Vc)$$
$$= -(VIN_+) \cdot Cs_0(1 + \alpha(-VIN_+))$$

Therefore, a quantity of transferred charge that contributes as a fully differential signal is determined by the following equation.

$$Q1 - Q2 = (VIN_+) \cdot Cs_0(1 - \alpha(VIN_+) + 1 - \alpha(VIN_+))$$
$$= (VIN_+) \cdot Cs_0(2 - 2\alpha(VIN_+))$$
$$= 2 \cdot (VIN_+) \cdot Cs_0 - 2\alpha(VIN_+)^2 \cdot Cs_0$$

Therefore, a term of a voltage dependence primary coefficient $\alpha$ remains as a second term, which serves as a sampling error component. when a sinusoidal wave having amplitude of A at a frequency $\omega$ is considered as an input signal, $VIN_+ = A\sin(\omega t)$ is established. The above second term is expressed by the following equation.

$$2\alpha(VIN_+)^2 \cdot Cs_0 = 2\alpha \cdot A^2 \cdot \sin^2(\omega t) \cdot Cs_0$$
$$= \alpha \cdot Cs_0 \cdot A^2(1 - \cos(2\omega t))$$

Since the above equation includes $\cos(2\omega t)$, a frequency component twice an input signal, that is, a second harmonic distortion component is generated. When the second harmonic distortion component is normalized by an original sampling charge quantity with respect to an input signal, $\alpha A/2$ is obtained. When $\alpha$ is at 100 ppm/V or less at A=1 V, the second harmonic distortion is about −86 dB.

However, in the recent fine process of semiconductor integrated circuits, $\alpha$ is increased from several hundreds ppm/V to about 1000 ppm/V in many cases. In the case of 1000 ppm/V, the second harmonic distortion increases to about −66 dB.

Regarding kinds of analog ICs such as an A/D converter used for audio, a permissible level of a harmonic distortion component with respect to an input signal has been generally −80 dB or less at the minimum in recent years, so that the above harmonic distortion of about −66 dB is at an analog characteristic level unsuitable for use.

Hence, the first object of the present invention is to provide a fully differential sampling circuit which reduces a sampling error so as to suppress the occurrence of a second harmonic component. The sampling error results from voltage dependence of a capacitance of a capacitor formed on a semiconductor substrate.

The second object of the present invention is to provide a delta sigma modulator, an A/D converter, and a switched capacitor filter circuit that can reduce cost and increase accuracy by including the above-mentioned fully differential sampling circuit.

SUMMARY OF THE INVENTION

The present invention comprises first and second sampling capacitors each composed of two upper and lower layer electrodes formed on a semiconductor substrate and a dielectric film between the electrodes, a first switch group for charging and discharging the first sampling capacitor, a second switch group for charging and discharging the second sampling capacitor, and a fully differential operational amplifier which connects a first integral capacitor between a negative input terminal and a positive output terminal and connects a second integral capacitor between a positive input terminal and a negative output terminal. The first switch group connects the first sampling capacitor between the first input terminal and a ground in a first period and between the second input terminal and the negative input terminal of the fully differential operational amplifier in a second period, and the second switch group connects the second sampling capacitor between the second input terminal and the ground in the first period and between the first input terminal and the positive input terminal of the fully differential operational amplifier in the second period. Further, the first sampling capacitor and the second sampling capacitor are opposite to each other in connecting direction.

Moreover, the present invention comprises first and second sampling capacitors each composed of two upper and lower layer electrodes formed on a semiconductor substrate and a dielectric film between the electrodes, first to fourth switches for charging and discharging the first sampling capacitor, fifth to eighth switches for charging and discharging the second sampling capacitor, and a fully differential operational amplifier which connects a first integral capacitor between a negative input terminal and a positive output terminal and connects a second integral capacitor between a positive input terminal and a negative output terminal. One of electrodes of the first sampling capacitor is connected to a first input terminal via the first switch and is connected to a second input terminal via the third switch, and the other electrode of the first sampling capacitor is grounded via the second switch and is connected to one of input terminals of the fully differential operational amplifier via the fourth switch. Moreover, one of electrodes of the second sampling capacitor is connected to the second input terminal via the fifth switch and is connected to a first input terminal via the seventh switch, and the other electrode of the second sampling capacitor is grounded via the sixth switch and is connected to the other input terminal of the fully differential operational amplifier via the eighth switch. Further, the first sampling capacitor and the second sampling capacitor are opposite to each other in connecting direction.

Besides, according to the present invention, in the fully differential sampling circuit, the first and second integral capacitors are each composed of the two upper and lower layer electrodes formed on the semiconductor substrate and the dielectric film between the electrodes. The first integral capacitor and the second integral capacitor have the same electrodes respectively connected to the corresponding input terminals of the fully differential operational amplifier.

Namely, when the upper layer electrode of the first integral capacitor is connected to the negative input terminal of the differential operational amplifier, the upper layer electrode of the second integral capacitor is also connected to the positive input terminal of the differential operational amplifier. When the lower layer electrode of the first integral capacitor is connected to the negative input terminal of the differential operational amplifier, the lower layer electrode of the second integral capacitor is also connected to the positive input terminal of the differential operational amplifier.

Additionally, according to the present invention, in the above fully differential sampling circuit, the fully differential operational amplifier includes positive and negative feedback paths, the positive and negative feedback paths include at least a first feedback capacitor and a second feedback capacitor which are each composed of two upper and lower layer electrodes formed on the semiconductor substrate and the dielectric film between the electrodes, and the first feedback capacitor and the second feedback capacitor are connected in the same direction.

Namely, when the upper layer electrode of the first feedback capacitor is connected to the negative input terminal of the fully differential operational amplifier, the upper layer electrode of the second feedback capacitor is also connected to the positive input terminal of the fully differential operational amplifier. When the lower layer electrode of the first feedback capacitor is connected to the negative input terminal of the fully differential operational amplifier, the lower layer electrode of the second feedback capacitor is also connected to the positive input terminal of the fully differential operational amplifier.

As described above, according to the present invention, the first and second sampling capacitors are each composed of the two upper and lower layer electrodes formed on the semiconductor substrate and the dielectric film between the electrodes, and the capacitors are opposite to each other in connecting direction.

Hence, according to the present invention, it is possible to eliminate conventional second harmonic distortion appearing depending upon a voltage coefficient of a capacitance of the capacitor formed on the semiconductor substrate, thereby achieving high performance.

Further, according to the present invention, even when the inverter amplifier is unnecessary, fully differential sampling can be performed from a single end input signal. Thus, the manufacturing cost can be reduced by omitting the inverter amplifier.

In order to attain the second object of the present invention, the following configuration is devised.

In a delta sigma modulator, the above fully differential sampling circuit is used as the sampling/holding function of the delta sigma modulator and the integrating function of a first stage.

The fully differential delta sigma modulator and a digital decimation filter constitute an A/D converter.

Moreover, in a switched capacitor filter circuit, a fully differential sampling circuit is disposed as a circuit of the first stage.

As described above, since the present invention includes the fully differential sampling circuit, it is possible to reduce the cost and increase accuracy.

DETAILED DESCRIPTION OF THE PREFERRED EMBODIMENTS

Hereunder preferred embodiments of the present invention will be discussed in accordance with the accompanied drawings.

Figure 1:
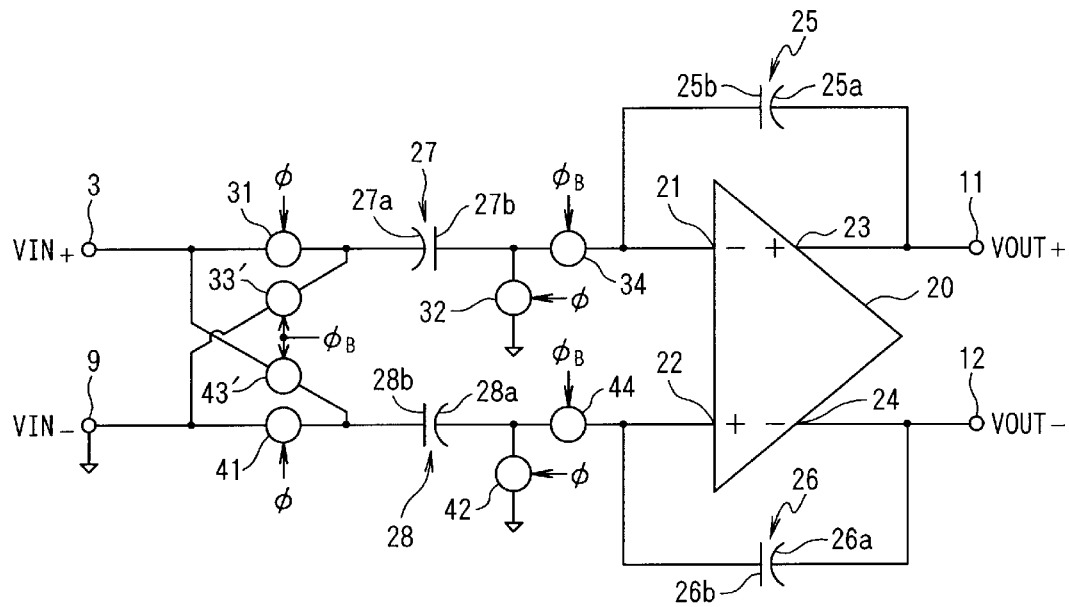
FIG. 1 is a circuit diagram showing the configuration of an embodiment in which a fully differential sampling circuit of the present invention is applied to a fully differential integrator.

Referring to FIG. 1, the following will discuss the configuration of Embodiment 1 of the present invention.

Embodiment 1 relates to a fully differential integrator of a single end input differential sampling method, in which fully differential integration is performed on a single end input signal by differentially sampling the signal at every cycle of an operating clock without using an inverter amplifier.

As shown in FIG. 1, the full differential integrator of Embodiment 1 comprises a first sampling capacitor 27, a second sampling capacitor 28, four switches 31, 32, 33', and 34 for charging and discharging the first sampling capacitor 27, four switches 41, 42, 43', and 44 for charging and discharging the second sampling capacitor 28, and a fully differential operational amplifier 20 including a first integral capacitor 25 and a second integral capacitor 26. A connecting direction (state) between an upper layer electrode 28b and a lower layer electrode 28a of the second sampling capacitor 28 is opposite to that of the first sampling capacitor 27.

Figure 9:
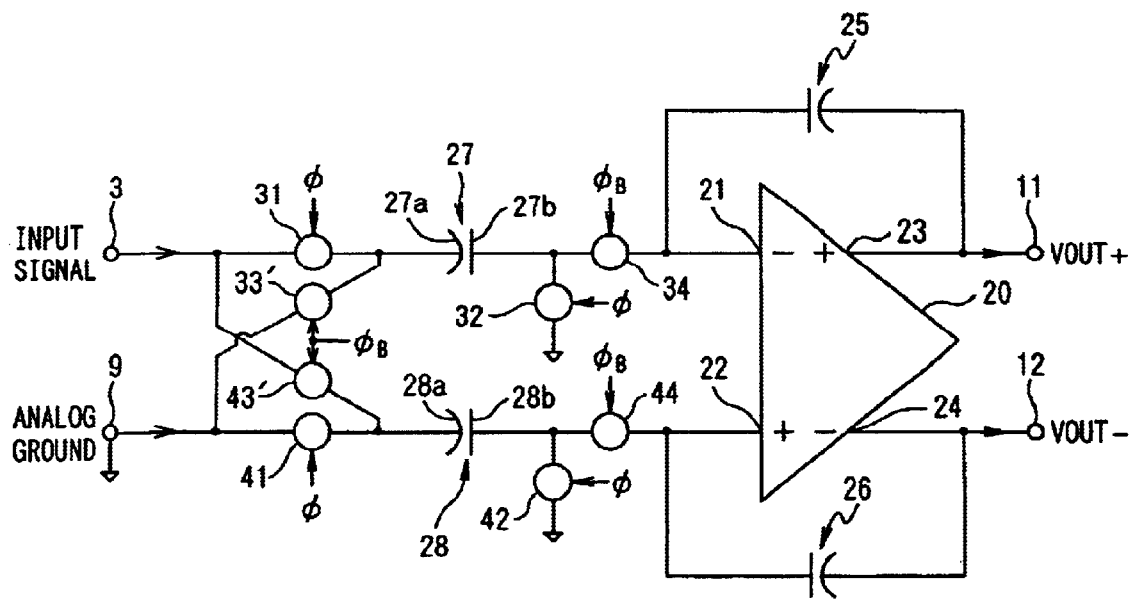
FIG. 9 is a diagram showing the configuration of another conventional fully differential switched capacitor integrator.
Figure 10:
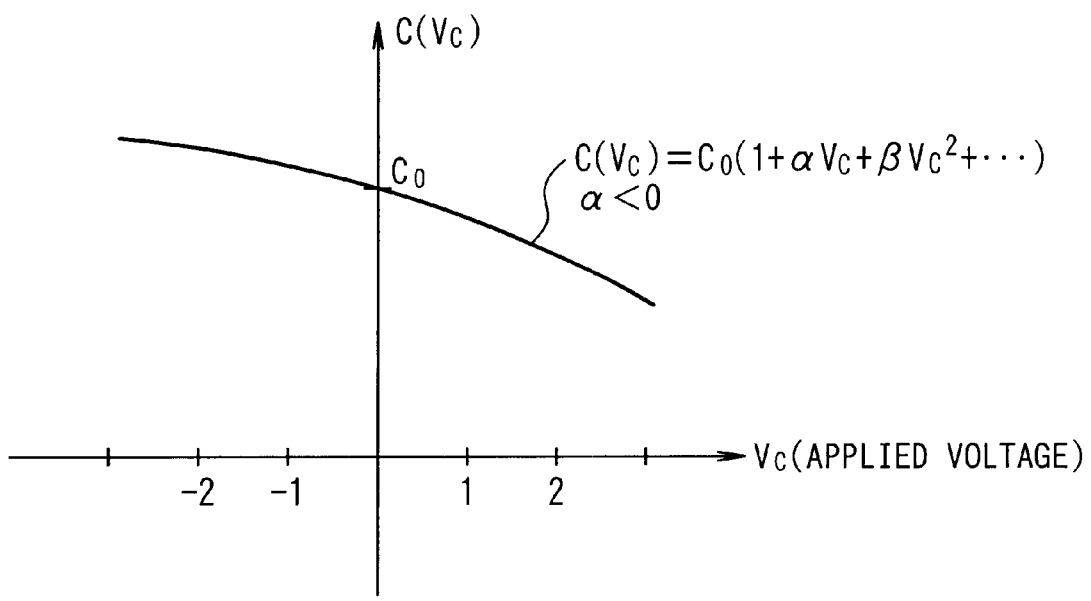
FIG. 10 is a diagram showing an example of the relationship between an applied voltage and a capacitance of the capacitor.

In this manner, the fully differential integrator of Embodiment 1 has some parts shared by the conventional circuit of FIG. 9. A major difference is that a connecting direction between the upper layer electrode 28b and the lower layer electrode 28a of the second sampling capacitor 28 is opposite to that of the first sampling capacitor 27. Therefore, in the following description of the configuration, the same members as the conventional circuit will be indicated by the same reference numerals and the difference will be mainly discussed.

Namely, as shown in FIG. 1, the lower layer electrode 27a of the first sampling capacitor 27 is connected to an input terminal 3 via the switch 31, which serves as a first switch, and is connected to an input terminal 9 via the switch 33', which serves as a third switch. Further, the upper layer electrode 27b of the first sampling capacitor 27 is grounded via the switch 32, which serves as a second switch, and is connected to a negative input terminal 21 of the fully differential operational amplifier 20 via the switch 34, which serves as a fourth switch.

Moreover, the upper layer electrode 28b of the second sampling capacitor 28 is connected to the input terminal 9 via the switch 41, which serves as a fifth switch, and is connected to the input terminal 3 via the switch 43', which serves as a seventh switch. Additionally, the lower layer electrode 28a of the second sampling capacitor 28 is grounded via the switch 42, which serves as a sixth switch, and is connected to a positive input terminal 22 of the fully differential operational amplifier 20 via the switch 44, which serves as an eighth switch.

Here, the opening and closing of the switches 31, 32, 33', and 34 and the switches 41, 42, 43', and 44 are controlled according to an operating clock. For example, when an operating clock is in positive phase ($\phi$=H, $\phi$B=L), the switches 31, 32, 41, and 42 are turned on and the switches 33', 34, 43', and 44 are tuned off. When an operating clock is in opposite phase ($\phi$=L, $\phi$B=H), the operation is reversed.

The first integral capacitor 25 has an upper layer electrode 25b and a lower layer electrode 25a respectively connected to the negative input terminal 21 and a positive output terminal 23 of the fully differential operational amplifier 20. Moreover, the second integral capacitor 26 has an upper layer electrode 26b and a lower layer electrode 26a respectively connected to the positive input terminal 22 and a negative output terminal 24 of the fully differential operational amplifier 20. Thus, the first integral capacitor 25 and the second integral capacitor 26 are provided in an equal connecting direction.

The following will describe that the fully differential integrator configured thus according to Embodiment 1 can cancel a primary coefficient $\alpha$ of voltage dependence of the capacitor as a fully differential sampling signal, the primary coefficient $\alpha$ causing a problem in the conventional method, and can reduce second harmonic distortion with respect to an input signal.

When an operating clock is in positive phase ($\phi$=H, $\phi$B=L), the switches 31, 32, 41, and 42 are turned on and the switches 33', 34, 43', and 44 are turned off.

Hence, the lower layer electrode 27a of the first sampling capacitor 27 is connected to the input terminal 3 via the switch 31, and the upper layer electrode 27b thereof is connected to an operating common potential (analog ground) via the switch 32. Besides, the upper layer electrode 28b of the second sampling capacitor 28 is connected to the input terminal 9 via the switch 41, and the lower layer electrode 28a is connected to the operating common potential via the switch 42.

Additionally, the input terminal 9 is connected to the analog ground, which is an operating reference voltage of an input signal.

As a result, when input signal (positive signal potential) $VIN_+$ is supplied to the input terminal 3, the following charge Q1 is accumulated in the lower layer electrode 27a of the first sampling capacitor 27.

$$Q1=(VIN_+)\cdot Cs=(VIN_+)\cdot Cs_0(1+\alpha V_c)$$

Further, Q1'=−Q1 is accumulated as relative charge in the upper layer electrode 27b of the first sampling capacitor 27. Meanwhile, charge Q2 accumulated in the upper layer electrode 28b of the second sampling capacitor 28 and charge Q2' accumulated in the lower layer electrode 28a are both discharged, so that Q2=Q2'=0 is obtained.

Therefore, the first sampling capacitor 27 samples the input signal $VIN_+$ and the second sampling capacitor 28 enters a discharging state.

Besides, regarding voltage dependence of the capacitor, an approximate expression to a linear term having a primary coefficient of $\alpha$ is used in the above manner, and $V_c$ is defined as a potential of second polysilicon, which serves as an upper layer electrode, relative to first polysilicon serving as a lower layer electrode. Hence, the following equation is obtained by substituting $V_c$=$-VIN_+$ into the above equation.

$$Q1=(VIN_+)\cdot Cs_0(1+\alpha(-VIN_+))$$

Next, when an operating clock is in opposite phase ($\phi$=L, $\phi$B=H), the switches 31, 32, 41, and 42 are turned off and the switches 33', 34, 43', and 44 are turned on.

Hence, the lower layer electrode 27a of the first sampling capacitor 27 is connected to the operating common potential via the switch 33', and the upper layer electrode 27b is connected to the negative input terminal 21 of the fully differential operational amplifier 20 via the switch 34. Moreover, the upper layer electrode 28b of the second sampling capacitor 28 is connected to the input terminal 3 via the switch 43', and the lower layer electrode 28a is connected to the positive input terminal 22 of the fully differential operational amplifier 20 via the switch 44.

As a result, charge Q1' accumulated in the first sampling capacitor 27 is shifted to the upper layer electrode 25b of the first integral capacitor 25, charge of −Q1'=Q1 is collected in the lower layer electrode 25a, and a potential $VOUT_+$ on the positive side of the output terminal 11 is determined by the following equation.

$$VOUT_+=-Q1'/Ci=Q1/Ci$$

Meanwhile, in the second sampling capacitor 28 discharged when an operating clock is in positive phase, the following charge Q2 is collected on the upper layer electrode 28b.

$$Q2=(VIN_+)\cdot Cs=(VIN_+)\cdot Cs_0(1+\alpha V_c)$$

Hence, charge of Q2'=−Q2 is supplied as relative charge to the lower layer electrode 28a of the second sampling capacitor 28 from the upper layer electrode 26b of the second integral capacitor 26.

As a result, in the second integral capacitor 26, charge −Q2' is collected on the side of the upper layer electrode 26b, charge Q2'=−Q2 is collected on the side of the lower layer electrode 26a, and a potential VOUT_ on the negative side of the output terminal 12 is determined by the following equation.

$$VOUT_-=Q2'/Ci=-Q2/Ci$$

Thus, a fully differential output VOUTdiff is determined by the following equation.

$$VOUTdiff = (VOUT_+) - (VOUT_-) = (Q1+Q2)/Ci$$

According to the above equation, a quantity of transferred fully differential charge is Q1+Q2 at every operating cycle.

Here, a potential applied to the second sampling capacitor 28 is $V_c = VIN_+$ because it is connected in an opposite direction from the first sampling capacitor 27, the upper layer electrode 28b is VIN+, and the lower layer electrode 28a serves as an analog ground. Charge Q2 of the upper layer electrode 28a is expressed by the following equation.

$$Q2 = (VIN_+) \cdot Cs_0 (1 + \alpha(VIN_+))$$

Hence, a quantity of transferred fully differential charge Q1+Q2 at every cycle of the fully differential sampling/holding function of Embodiment 1 is expressed by the following equation.

$$Q1+Q2 = (VIN_+) \cdot Cs_0(1+\alpha(-VIN_+)+1+\alpha(VIN_+)) = (VIN_+) \cdot Cs_0 \cdot 2$$

According to the above equation, a primary coefficient α of voltage dependence is completely canceled. Therefore, according to Embodiment 1, it is possible to provide a fully differential sampling circuit which does not have a sampling error resulting from voltage dependence of the sampling capacitor. The sampling error has been a main cause of a second harmonic in the conventional technique.

The following will discuss the influence of the voltage dependence in the first integral capacitor 25 and the second integral capacitor 26.

In Embodiment 1, the electrodes of the first integral capacitor 25 and the second integral capacitor 26 are connected in the same direction (FIG. 1). Thus, applied electrodes $Vc_1$ and $Vc_2$ of the first integral capacitor 25 and the second integral capacitor 26 are determined by the following equation.

$$Vc_1 = -VOUT_+$$

$$Vc_2 = -VOUT_-$$

Further, when a reference capacitance is $Ci_0$ at an applied voltage of Vc=0, capacitances $Ci_1$ and $Ci_2$ are determined by the following equations.

$$Ci_1 = Ci_0(1 - \alpha(VOUT_+))$$

$$Ci_2 = Ci_0(1 - \alpha(VOUT_-))$$

When the values $Ci_1$ and $Ci_2$ are substituted into the equations of potentials $VOUT_+$ and $VOUT_-$ of the output terminal, and an approximate expression of α<<1, that is, $$1/(1-\alpha Vc) = (1+\alpha Vc)/((1-(\alpha Vc)^2) \approx 1+\alpha Vc$$

is used, the potentials $VOUT_+$ and $VOUT_-$ are determined by the following equations.

$$VOUT_+ = Q1/Ci_0(1 - \alpha(VOUT_+))$$
$$= Q1 \cdot (1 + \alpha(VOUT_+))/Ci_0$$
$$= (VIN_+) \cdot Cs_0(1 - \alpha(VIN_+)) \cdot (1 + \alpha(VOUT_+))/Ci_0$$

$$VOUT_- = -Q2/Ci_0(1 - \alpha(VOUT_-))$$
$$= -Q2 \cdot (1 + \alpha(VOUT_-))/Ci_0$$
$$= -(VIN_+) \cdot Cs_0(1 + \alpha(VIN_+)) \cdot (1 + \alpha(VOUT_-))/Ci_0$$

Here, since $VOUT_- = -VOUT_+$ is obtained, a potential $VOUT_-$ of the output terminal 12 is determined by the following equation.

$$VOUT_- = -(VIN_+) \cdot Cs_0(1+\alpha(VIN_+)) \cdot (1 - \alpha(VOUT_+))/Ci_0$$

Therefore, a fully differential output VOUTdiff is determined by the following equation.

$$VOUTdiff = (VOUT_+) - (VOUT_-)$$
$$\approx (VIN_+) \cdot Cs_0(2 - 2\alpha^2(VIN_+)(VOUT_+))/Ci_0$$

According to the above equation, linear terms of α are canceled by each other and only a second term remains. Since α is about 1000 ppm/V, $\alpha^2$ is about 1 ppm/V$^2$, which is small enough to be ignored. Therefore, a fully differential output VOUTdiff is determined by the following equation.

$$VOUTdiff = 2(VIN_+) \cdot Cs_0/Ci_0$$

According to the above equation, Embodiment 1 makes it possible to cancel voltage dependence of the capacitor to a sufficiently negligible level and to achieve the accurate sampling/holding function and the fully differential integrating function without second harmonic distortion.

Besides, in the above-mentioned Embodiment 1, for simple explanation, a method of connecting the sampling capacitors 27 and 28 and an input signal inputted to the input terminals 3 and 9 are both limited to a single kind. The present invention is not limited to the above configuration.

Namely, when the upper layer electrode 27b of the first sampling capacitor 27 is connected to the input terminal 3 and the lower layer electrode 28a of the second sampling capacitor 28 is connected to the input terminal 9, like Embodiment 1, the sampling capacitors 27 and 28 are connected in relatively opposite directions, thereby achieving the same result.

Further, in some applications, it is also possible to supply a single end input signal from the input terminal 9 of FIG. 1 and fix an input terminal PIN on an analog ground.

Additionally, the integral capacitors 25 and 26 are acceptable as long as they are equal in relative direction as described above. Therefore, even when the lower layer electrode 25a of the first integral capacitor 25 is connected to the negative input terminal 21 of the fully differential operational amplifier 20, the upper layer electrode 25b is connected to the positive output terminal 23, the lower layer electrode 26a of the second integral capacitor 26 is connected to the positive input terminal 22 of the fully differential operational amplifier 20, and the upper layer electrode 26b is connected to the negative output terminal 24, the same effect can be achieved.

As Embodiment 2 of the present invention, the following will discuss a fully differential switched capacitor filter circuit, in which a fully differential sampling method for inputting a single end is used as the sampling/holding function on a first stage, in accordance with accompanied drawings.

The switched capacitor filter circuit is generally formed by a plurality of filter stages having the first order or the second order that make cascade connection. When the filter stages are composed of fully differential circuits, other than a firstly captured signal of a continuous-time system, that is, other than a sampling/holding circuit, all values can be handled as fully differential sampling values in the fully differential switched capacitor circuit.

Therefore, when conversion is made from single end input on the first filter stage to a fully differential sampling value, the desired object can be attained simply by performing accurate sampling using the method of the present invention.

Namely, on the subsequent stage, a sampling value produced as a fully differential signal is processed by sampling. Like the conventional technique for handling a fully differential signal, it is possible to process a fully differential signal which can complementarily cancel the influence of a voltage dependence coefficient α of the capacitor.

Figure 2:
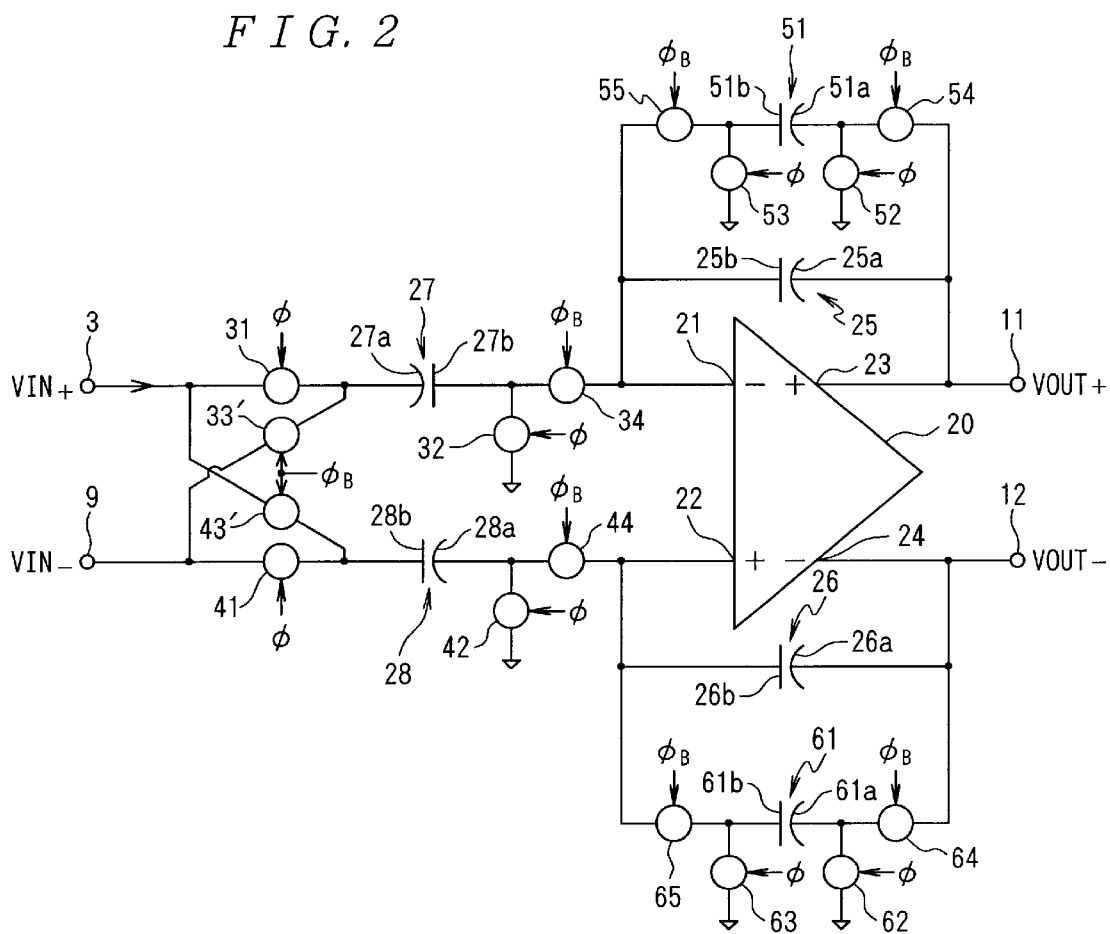
FIG. 2 is a circuit diagram showing the configuration of an embodiment of a fully differential switched capacitor circuit according to the present invention.

Therefore, referring to FIG. 2, Embodiment 2 will describe a configuration in which a switched capacitor feedback path exists on a first stage for performing differential sampling on a single end input signal.

For simple explanation, in Embodiment 2, a primary low-pass filter is formed by adding a fully differential feedback path to the fully differential integrator of FIG. 1. Thus, in the following explanation on the configuration, the same members as the fully differential integrator of FIG. 1 are indicated by the same reference numerals, and the configuration of the additional fully differential feedback path will be mainly discussed.

Namely, as shown in FIG. 2, the following members are added in Embodiment 2: a positive signal feedback path composed of a first feedback capacitor 51 having a capacitance of Cf, and four switches 52 to 55, and a negative feedback path composed of a second feedback capacitor 61 having a capacitance of Cf and four switches 62 to 65.

The feedback capacitors 51 and 61 are characterized in that upper and lower layers are relatively equal in direction of electrodes. In this example, lower layer electrodes 51a and 61a are disposed on the side of output terminals 23 and 24 of a fully differential operational amplifier 20, and upper layer electrodes 51b and 61b are disposed on the side of input terminals 21 and 22 of the fully differential operational amplifier 20.

Namely, the first feedback capacitor 51 has the lower layer electrode 51a connected to the positive output terminal 23 of the fully differential operational amplifier 20 via the switch 54, and the upper layer electrode 51b connected to the negative input terminal 21 of the fully differential operational amplifier 20 via the switch 55. In this manner, the second feedback capacitor 61 has the lower layer electrode 61a connected to the negative output terminal 24 of the fully differential operational amplifier 20 via the switch 64, and the upper layer electrode 61b connected to the positive input terminal 22 of the fully differential operational amplifier 20 via the switch 65.

Here, the opening/closing control of the switches 52 to 55 and the switches 62 to 65 is performed according to an operating clock. For example, when an operating clock is in positive phase (φ=H, φB=L), the switches 52, 53, 62, and 63 are turned on and the switches 54, 55, 64, and 65 are turned off. When an operating clock is in opposite phase (φ=L, φB=H), the operation is reversed.

Subsequently, regarding the fully differential switched capacitor circuit configured thus according to Embodiment 2, the operations of the positive signal feedback path and the negative signal feedback path will be discussed.

When an operating clock is in positive phase (φ=H, φB=L), the switches 52, 53, 62, and 63 are turned on and the switches 54, 55, 64, and 65 are turned off.

Thus, the lower layer electrode 51a and the upper layer electrode 51b of the first feedback capacitor 51 are both connected to an analog ground to enter a discharging state, and the lower layer electrode 61a and the upper layer electrode 61b of the second feedback capacitor 61 are both connected to an analog ground to enter a discharging state.

Meanwhile, when the operating clock is in opposite phase (φ=L, φB=H), the switches 52, 53, 62, and 63 are turned off and the switches 54, 55, 64, and 65 are turned on.

Hence, the first feedback capacitor 51 has the lower layer electrode 51a connected to the positive output terminal 23 of the fully differential operational amplifier 20 via the switch 54, and the upper layer electrode 51b connected to the negative input terminal 21 of the fully differential operational amplifier 20 via the switch 55. Further, the second feedback capacitor 61 has the lower layer electrode 61a connected to the negative output terminal 24 of the fully differential operational amplifier 20 via the switch 64, and the upper layer electrode 61b connected to the positive input terminal 22 of the fully differential operational amplifier 20 via the switch 65.

Therefore, the lower layer electrode 51a of the first feedback capacitor 51 absorbs the following charge Q3.

$$Q3 = (VOUT_+) \cdot Cf$$
$$= (VOUT_+) \cdot Cf_0 \cdot (1 - \alpha(VOUT_+))$$

Moreover, the upper layer electrode 51b of the first feedback capacitor 51 absorbs relative charge −Q3 from the negative input terminal 21 of the fully differential operational amplifier 20. The absorbed charges are discharged to the analog ground in positive phase of a subsequent operating clock.

Namely, the above operation is equivalent to subtraction of charge Q3 from a quantity of accumulated charge in the first integral capacitor 25. The following change in output potential is made at every operating cycle.

$$\Delta(VOUT_+) = -Q3/Ci$$

In this manner, the lower layer electrode 61a of the second feedback capacitor 61 absorbs the following charge Q4.

$$Q4 = (VOUT_-) \cdot Cf$$
$$= (VOUT_-) \cdot Cf_0 \cdot (1 - \alpha(VOUT_-))$$

Also, the upper layer electrode 61b of the second feedback capacitor 61 absorbs relative charge −Q4 from the positive input terminal 22 of the fully differential operational amplifier 20. The absorbed charges are discharged to the analog ground in positive phase of a subsequent operating clock.

Namely, the above operation is equivalent to subtraction of charge Q4 from a quantity of accumulated charge in the second integral capacitor 26. The following change in output potential is made at every operating cycle.

$$\Delta(VOUT_-) = -Q4/Ci$$

Here, $VOUT_- = -VOUT_+$ is obtained, the above charge Q4 is determined by the following equation.

$$Q4 = -(VOUT_+) \cdot Cf_0 \cdot (1 + \alpha(VOUT_+))$$

Therefore, a subtracted charge Q3−Q4, which serves as a fully differential signal handled by the feedback path in a single operating cycle, is determined by the following equation.

$$Q3 - Q4 = (VOUT_+) \cdot Cf_0 \cdot 2$$

Hence, a level of a fully differential output signal is changed as expressed by the following equation.

$$\Delta(VOUT_{diff}) = -(Q3-Q4)/Ci = -2(VOUT_+) \cdot Cf_0/Ci$$

Therefore, a term of a primary coefficient α of voltage dependence is complementarily canceled as a fully differential signal, thereby achieving an accurate feedback path.

Besides, the operations of the sampling capacitors 27 and 28 and voltage dependence of the integral capacitors 25 and 26 are the same as the above description, and the explanation thereof is omitted.

Hence, according to Embodiment 2, it is possible to achieve an accurate switched capacitor filter circuit, which can eliminate the necessity for an inverter amplifier for a single end input signal and eliminate the influence of a primary coefficient of voltage dependence of the capacitor that causes second harmonic distortion.

The following will discuss Embodiment 3, in which the present invention is applied to an oversampling delta sigma A/D converter.

The oversampling delta sigma A/D converter includes a delta sigma modulator for performing A/D conversion of a small number of bits that shifts quantization noise to a high frequency region, which is out of a target band, at a high oversampling ratio. The oversampling delta sigma A/D converter adopts a method in which decimation (frequency thinning-out) is performed on data of a small number of bits having a high sampling frequency that are outputted from the modulator, to a low sampling frequency via a digital decimation filter (frequency thinning-out filter) while removing noise of the high frequency region, so that the data is converted to multiple-bit PCM data.

A variety of methods have been proposed as a modulation method. What all the methods have in common is that the above output of small number of bits is subjected to D/A conversion and feedback for the first stage that samples the input analog signal.

Figure 3:
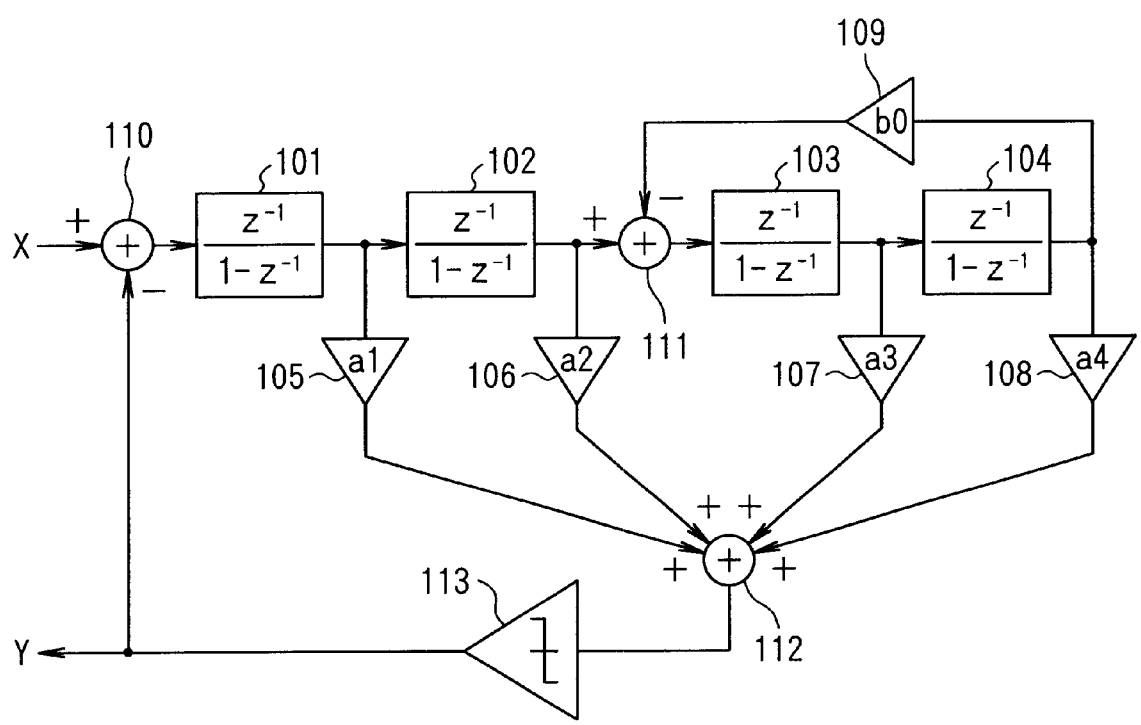
FIG. 3 is a block diagram for explaining the configuration of a delta sigma modulator of the present invention.
Figure 4:
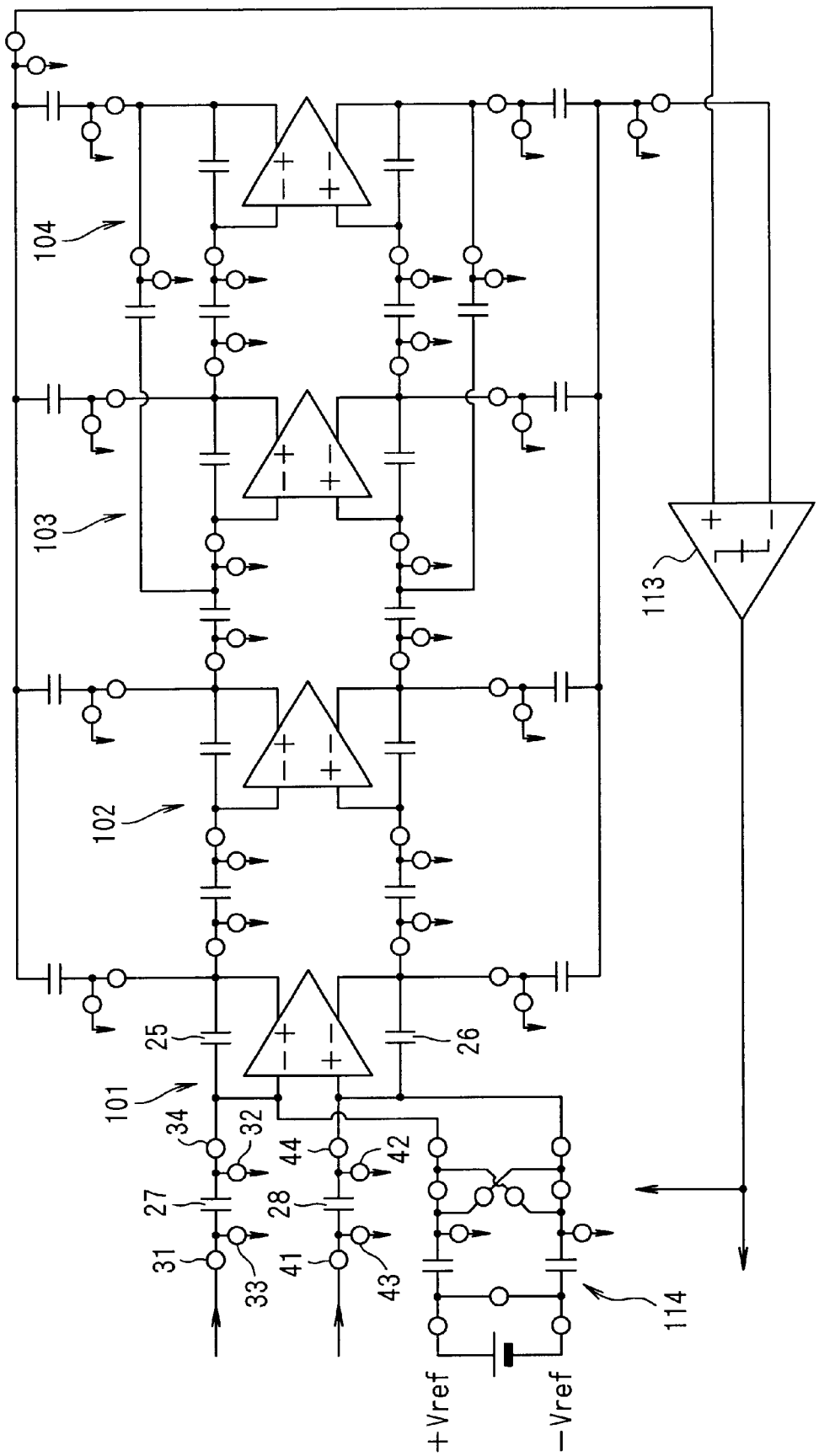
FIG. 4 shows the delta sigma modulator in a conventional fully differential switched capacitor circuit on the assumption that positive and negative fully differential signals are inputted.

Next, as a specific example of the delta sigma modulator, FIG. 3 schematically shows a fourth-order 1-bit delta sigma modulator, and FIG. 4 shows the modulator by using a conventional fully differential switched capacitor circuit on the assumption that positive and negative fully differential signals are inputted.

As shown in FIG. 3, the delta sigma modulator comprises integrators 101 to 104 of a discrete value system, coefficient units 105 to 108 having weight coefficients a1 to a4, a coefficient unit 109 having a weight coefficient of b0, adders 110 to 112, and a 1-bit quantizer 113.

Further, in the delta sigma modulator, the four integrators 101 to 104 make cascade connection as illustrated, and a fourth-order loop filter is formed in which the outputs of the integrators 101 to 104 are multiplied by the weight coefficients a1 to a4 of the coefficient units 105 to 108, are added by the adder 112, and are outputted. Moreover, the output of the adder 112 is subjected to 1-bit quantization by the 1-bit quantizer 113, the 1-bit output is subjected to D/A conversion as a positive or negative full-scale value, and feedback is made to the adder 110 on a first stage for capturing input X after a delay of one operating cycle.

Here, since output Y has 1-bit, Y=1 indicates positive full-scale value output, and a negative full scale value is supplied to the first stage with feedback. Y=0 indicates negative full-scale value output, and a positive full-scale value is supplied to the first stage with feedback.

Figure 7:
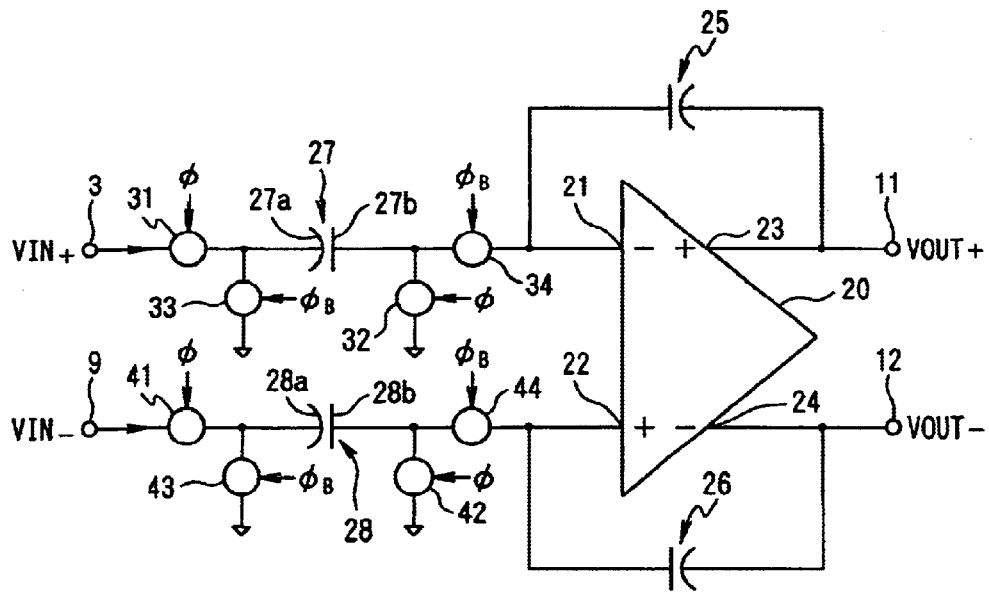
FIG. 7 is a diagram showing the configuration of a conventional fully differential switched capacitor integrator.
Figure 8:
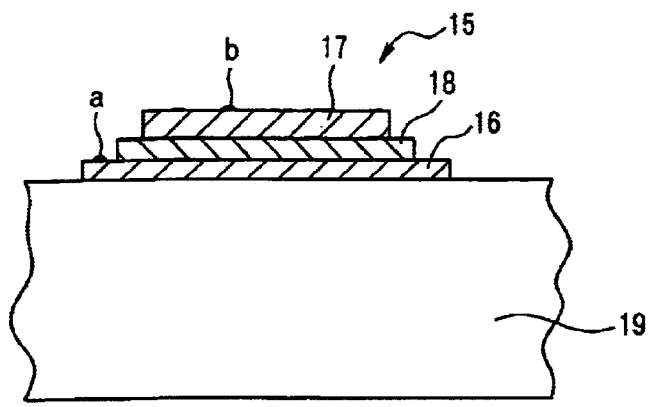
FIG. 8(A) is an explanatory drawing showing a capacitor formed on a semiconductor substrate.
FIG. 8(B) is a diagram showing symbols thereof.
Figure 8:
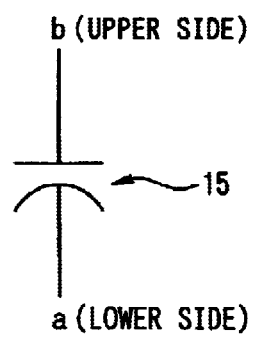

In FIG. 4, the plurality of integrators 101 to 104 is equivalent to the integrators of FIG. 7. Thus, reference numerals are assigned only in the integrator 101 on the first stage, and specific reference numerals are omitted in the integrators 102 to 104 on the second to fourth stages. Besides, the integrator 101 on the first stage includes a full-scale value feedback path 114, which will be described later.

Incidentally, in FIG. 3, when the fourth-order loop filter has a transfer function of H(z) and quantization noise of Qn(z), which is added in the 1-bit quantizer, output Y(z) is obtained by the following equation.

$$Y(z) = (X(z) - Y(z^{-1})) \cdot H(z) + Qn(z)$$

Thus, the following equation is obtained from the above equation.

$$(1 + z^{-1} \cdot H(z)) \cdot Y(z) = X(z) \cdot H(z) + Qn(z)$$

Here, in a low frequency region around z=1, H(z) is a fourth-order integrating characteristic. Since H(z)>>1 is found, Y(z) can be approximated as expressed by the following equation.

$$Y(z) \approx X(z) + Qn(z)/H(z)$$

Hence, the quantization noise Qn(z) is subjected to noise shaping with a characteristic of 1/H(z).

Namely, the following configuration is available: most of quantization noise added by 1-bit quantization is distributed on a high frequency region and the distribution of quantization noise on a low frequency region, which is a target signal band, is quite small. Additionally, quantization noise distributed on a high frequency region can be removed almost completely by a digital decimation filter on a subsequent stage.

Therefore, by setting an oversampling ratio at, for example, about 64 times, regarding quantization noise, an A/D converter with an S/N ratio of 100 dB or more can be readily formed in theory.

However, in addition to the above quantization noise, actual LSI has noise caused by various analog elements such as an operational amplifier, C/kT noise of a switched capacitor circuit, and various kinds of digital noise, and the above noise is added to the quantization noise. Hence, an A/D converter for audio cannot be readily formed with THD (fully harmonic distortion) of −80 dB or less and an S/N ratio of 90 dB or more.

However, in view of a closed loop formed entirely in the system that is the characteristic of the delta sigma method, it is understood that a circuit from a buffer to a first-stage integrator, which the buffer is to supply an input signal and the first-stage integrator is to perform a sampling/holding function and full-scale value feedback, dominantly determines the entire analog characteristics.

Thus, the fully differential sampling/holding method for single end input according to the present invention is applied to the integrator on the first stage. Thus, as described in the above embodiments, it is possible to eliminate the necessity for an additional inverter amplifier and to provide a high-precision A/D converter with reduced second harmonic distortion at low cost.

Figure 5:
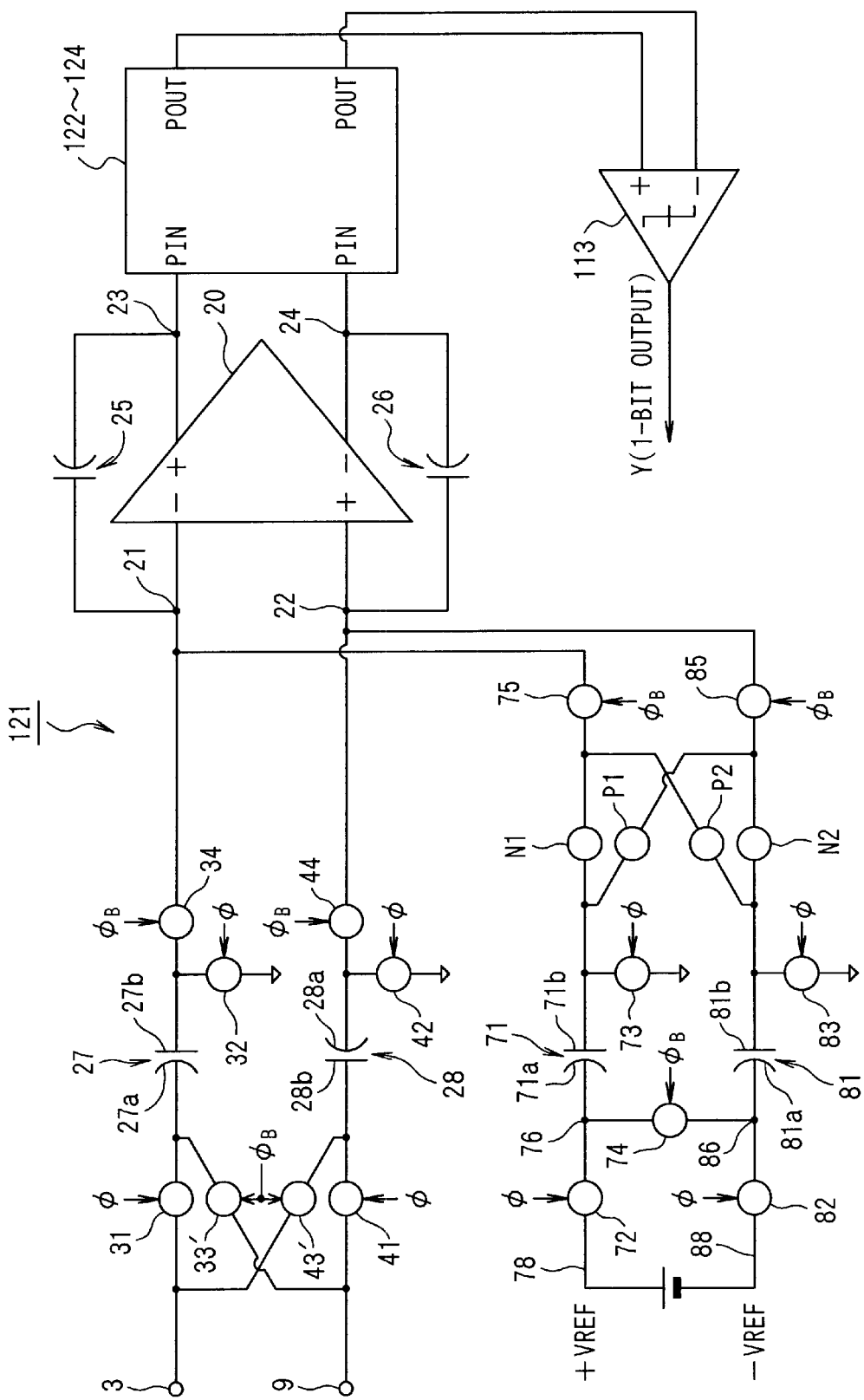
FIG. 5 is a circuit diagram showing the configuration of an embodiment of the delta sigma modulator of the present invention.
Figure 6:
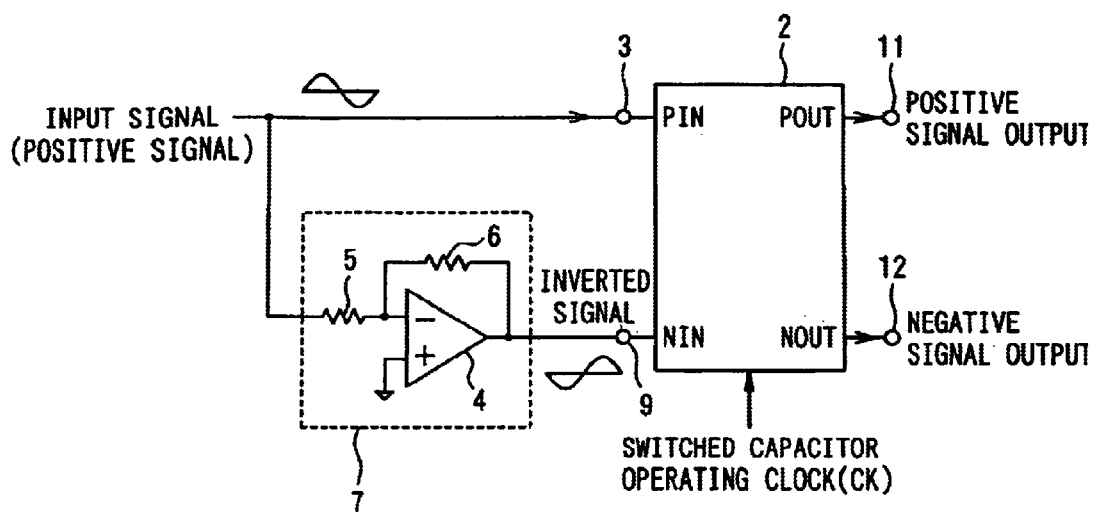
FIG. 6 is a diagram showing the configuration of a conventional fully differential interface.

FIG. 5 shows an example of the fully differential delta sigma modulator for single end input according to the present invention.

As shown in FIG. 5, the modulator includes integrators 122 to 124 on the second to fourth stages and a 1-bit quantizer 113 in addition to an integrator 121 on a first stage. In the integrator 121 on the first stage, positive and negative full-scale value feedback paths are added for feeding back positive and negative full-scale values to the integrator of FIG. 1 according to 1-bit data, and the integrators 122 to 124 on the second to fourth stages are basically identical in configuration to the typical fully differential switched capacitor integrator of FIG. 7.

The positive full-scale value feedback path is composed of a first reference capacitor 71 having a capacitance of Cr, switches 72 to 75, and so on. Further, the negative full-scale value feedback path is composed of a second reference capacitor 81 having a capacitance of Cr, switches 82, 83, and 85, and so on. Moreover, path selecting switches P1, P2, N1, and N2 are included for switching charge transmission paths according to a value of 1-bit data outputted from the 1-bit quantizer 113. Besides, a direct-current power supply is connected to the end of the switch 72 and the end of the switch 82.

Here, the switches 72 to 75 and the switches 82, 83, and 85 are opened and closed according to an operating clock (described later). Further, the switches P1, P2, N1, and N2 are switched according to a value of 1-bit data outputted from the 1-bit quantizer 113 (described later).

The other configurations of the integrator 121 on the first stage are the same as those of the integrator show in FIG. 1. Hence, the same members are indicated by the same reference numerals and the description thereof is omitted.

Additionally, the switch 74 is provided for short-circuiting nodes 76 and 86 for sampling positive and negative reference voltages VREF. Thus, only one switch 74 is provided on full-scale value feedback paths.

The following will discuss the operating of the full-scale value feedback path in the fully differential delta sigma modulator configured thus.

When the operating clock is in positive phase, the switches 72, 73, 82, and 83 are turned on and the switches 74, 75, and 85 are turned off.

Thus, on the positive full-scale value feedback path, charge of QP=(+VREF)·Cr is sampled in the first reference capacitor 71. Further, on the negative full-scale value feedback path, charge of QN=(−VREF)·Cr is sampled in the second reference capacitor 81.

Meanwhile, when the operating clock is in opposite phase, the switches 72, 73, 82, and 83 are turned off and the switches 74, 75, and 85 are turned on. At this moment, the opening and closing of the switches P1, P2, N1, and N2 are controlled according to a value of 1-bit data outputted from the 1-bit quantizer 113. Therefore, the above charges QP and QN are selectively transferred to the integral capacitor 25 or the integral capacitor 26 according to a value of 1-bit data.

Namely, when the 1-bit data outputted from the 1-bit quantizer 113 is "1" (Y=H), the path selecting switches P1 and P2 are turned on. As a result, the positive charge QP is transferred to the negative integral capacitor 26 and the negative charge QN is transferred to the positive integral capacitor 25 to subtract a positive full-scale value.

Conversely, when the 1-bit data is "0" (Y=L), the path selecting switches N1 and N2 are turned on. As a result, the positive charge QP is transferred to the positive integral capacitor 25 and the negative charge QN is transferred to the negative integral capacitor 26 to subtract a negative full-scale value.

Incidentally, in the configuration of FIG. 5, the influence of a voltage dependence primary coefficient on the reference capacitors 71 and 81 is determined not only by connecting directions of the capacitors 71 and 81 but also by the relative relationship between a reference potential±VREF and an analog ground (normally a half of power supply voltage is used), which serves as an internal operating reference potential.

Therefore, a variety of combinations are available. Since a sampled reference potential±VREF is a fixed value, charge transfer (QP−QN) serving as a fully differential signal at one operating cycle is constant. Thus, high-frequency distortion does not occur and only a small error of a full-scale value appears in A/D conversion.

Therefore, even when a term of a primary coefficient $\alpha$ of about 1000 ppm/V remains, the term indicates an error of about one thousandth with respect to a value of a reference potential±VREF. Considering that a typical reference potential±VREF value is about 1% in manufacturing variation accuracy, the error is sufficiently negligible.

Hence, the connecting directions of the reference capacitors 71 and 81 cause no particular problem.

As an example, FIG. 5 shows that the reference capacitors 71 and 81 are connected in the same direction. When potentials V1 and V2 of terminals 78 and 88 for supplying reference voltage +VREF are positive and negative potentials relative to an internal analog ground (VCOM), the potentials V1 and V2 are expressed by the following equations.

$$V1 = VCOM + VREF$$

$$V2 = VCOM - VREF$$

As a result, charges QP and QN are expressed by the following equations.

$$QP = +VREF \cdot Cr_0 \cdot (1 - \alpha(+VREF))$$

$$QN = -VREF \cdot Cr_0 \cdot (1 - \alpha(-VREF))$$

Therefore, a quantity of transferred charge (QP−QN) of a fully differential signal is expressed by the following equation and a linear term of a voltage dependence primary coefficient $\alpha$ is cancelled.

$$(QP - QN) = VREF \cdot Cr_0 \cdot 2$$

Here, $Cr_0$ of the above equation is a reference capacitance when the reference capacitor has an applied voltage of 0.

Meanwhile, when a potential shared by the internal analog ground (VCOM) is used for the V1 terminal and the V2 terminal is used for 0V serving as a power supply ground to reduce the cost of the entire circuit, VCOM=2·VREF is obtained and charges QP and QN are expressed by the following equations.

$$QP = +VREF \cdot Cr_0 \cdot (1 + \alpha \cdot VREF)$$

$$QN = -VREF \cdot Cr_0 \cdot (1 + 3\alpha \cdot VREF)$$

Therefore, transfer charge (QP−QN) of a fully differential signal is expressed by the following equation.

$$(QP - QN) = VREF \cdot Cr_0 \cdot 2(1 + 2\alpha \cdot VREF)$$
$$= VCOM \cdot Cr_0 (1 + \alpha \cdot VCOM)$$

According to the above equation, a linear term of a voltage dependence primary coefficient $\alpha$ remains. The term only results in a gain error which multiplies a full-scale level of 2VREF=VCOM by (1+$\alpha$·VCOM) times. As expressed in the above equation, the term does not cause harmonic distortion occurring in a sampling capacitor.

Here, in the case of $\alpha$=1000 ppm/V and VCOM=2.5 V, a gain error of (1+$\alpha$·VCOM)=1.0025 times is obtained, which is about 0.25% of a target value. It is apparent that the gain error is within a range causing no problem in practical use, as compared with variation of about 1 to 2% in manufacturing that is obtained when an ordinary reference power supply source of a band gap type is used as VCOM.

The delta sigma modulator of the present embodiment uses the above-mentioned sampling method for a single end input signal. As described above, from capturing of signal charge serving as an actual fully differential signal to integration of the integrator, the influence of a voltage dependence primary coefficient α is complementarily canceled, thereby causing no adverse effect on an analog characteristic. Hence, it is possible to provide an A/D converter which can sufficiently reduce second harmonic distortion with satisfactory characteristics while eliminating the necessity for an inverter amplifier for generating an additional negative signal.

As described above, in the present invention, the first and second sampling capacitors are each composed of two upper and lower layer electrodes formed on a semiconductor substrate and a dielectric film between the electrodes, and the capacitors are opposite to each other in connecting direction.

For this reason, according to the present invention, it is possible to eliminate conventional second harmonic distortion occurring depending upon a voltage coefficient of a capacitance of the capacitor formed on the semiconductor substrate, thereby achieving high performance.

Further, by including the fully differential sampling circuit of the present invention, it is possible to reduce the cost and to increase accuracy.

What is claimed is:

1. A fully differential sampling circuit, comprising:

first and second sampling capacitors each composed of an upper layer and a lower layer electrode formed on a semiconductor substrate and a dielectric film between said electrodes, a first switch group for charging and discharging said first sampling capacitor, a second switch group for charging and discharging said second sampling capacitor, and a fully differential operational amplifier which connects a first integral capacitor between a negative input terminal and a positive output terminal and connects a second integral capacitor between a positive input terminal and a negative output terminal, wherein said first switch group connects said first sampling capacitor between a first input terminal and a ground in a first period and between a second input terminal and said negative input terminal of said fully differential operational amplifier in a second period, said second switch group connects said second sampling capacitor between said second input terminal and the ground in said first period and between said first input terminal and said positive input terminal of said fully differential operational amplifier in said second period, and the upper layer and lower layer of the first sampling capacitor being connected between the first input terminal and the differential operational amplifier in a direction opposite to the connection of the upper layer and lower layer of the second sampling capacitor between the second input terminal and the differential operational amplifier.

2. A fully differential sampling circuit, comprising:

first and second sampling capacitors each composed of an upper layer and a lower layer electrode formed on a semiconductor substrate and a dielectric film between said electrodes, first to fourth switches for charging and discharging said first sampling capacitor, fifth to eighth switches for charging and discharging said second sampling capacitor, and a fully differential operational amplifier which connects a first integral capacitor between a negative input terminal and a positive output terminal and connects a second integral capacitor between a positive input terminal and a negative output terminal, wherein one of electrodes of said first sampling capacitor is connected to a first input terminal via said first switch and is connected to a second input terminal via said third switch, and the other electrode of said first sampling capacitor is grounded via said second switch and is connected to one of input terminals of said fully differential operational amplifier via said fourth switch, one of electrodes of said second sampling capacitor is connected to said second input terminal via said fifth switch and is connected to the first input terminal via said seventh switch, and the other electrode of said second sampling capacitor is grounded via said sixth switch and is connected to the other input terminal of said fully differential operational amplifier via said eighth switch, and said electrodes of said first sampling capacitor and said electrodes of said second sampling capacitor are connected in reverse polarity with respect to each other.

3. The fully differential sampling circuit according to claim 1 or 2, wherein said first and second integral capacitors are each composed of an upper layer and a lower layer electrode formed on the semiconductor substrate and dielectric film between the electrodes, said first integral capacitor and said second integral capacitor are connected in the same polarity with respect to each other and have the corresponding electrodes respectively connected to separate input terminals of said fully differential operational amplifier.

4. The fully differential sampling circuit according to claim 1 or 2, wherein said fully differential operational amplifier includes positive and negative feedback paths, said positive and negative feedback paths include at least a first feedback capacitor and a second feedback capacitor which are each composed of an upper layer and a lower layer electrode formed on said semiconductor substrate and dielectric film between said electrodes, and said first feedback capacitor and said second feedback capacitor are connected in the same polarity with respect to each other.

5. A fully differential delta sigma modulator, comprising said fully differential sampling circuit according to claim 1 or 2, said fully differential sampling circuit providing sampling/holding functions and an integrating function in a first stage in said delta sigma modulator.

6. An oversampling delta sigma A/D converter, comprising said fully differential delta sigma modulator according to claim 5, and a digital decimation filter.

7. A fully differential switched capacitor filter circuit, wherein said fully differential sampling circuit according to claim 1 or 2 is disposed as a first stage in said switched capacitor filter circuit.

* * * * *